United States Patent [19]

Dorinski et al.

[11] Patent Number: 5,110,298
[45] Date of Patent: May 5, 1992

[54] SOLDERLESS INTERCONNECT

[75] Inventors: Dale W. Dorinski, Coral Springs; Mac W. Branan, Ft. Lauderdale, both of Fla.

[73] Assignee: Motorola, Inc., Schaumburg, Ill.

[21] Appl. No.: 759,737

[22] Filed: Sep. 12, 1991

Related U.S. Application Data

[63] Continuation of Ser. No. 558,282, Jul. 26, 1990, abandoned.

[51] Int. Cl.$^5$ .............................................. H01R 9/09
[52] U.S. Cl. ....................................... 439/65; 439/55
[58] Field of Search ..................... 439/64, 65, 55, 67, 439/74, 77, 629, 636, 632, 493, 497

[56] References Cited

U.S. PATENT DOCUMENTS

| | | | |
|---|---|---|---|
| 3,214,725 | 10/1965 | De Rose et al. | 439/497 |
| 3,579,206 | 5/1971 | Grange | 439/493 |
| 3,878,341 | 4/1975 | Balde | 439/493 |
| 3,997,236 | 12/1976 | Bresin. | |
| 4,366,198 | 12/1982 | Ramspacher, Jr. | 439/55 |
| 4,513,064 | 4/1985 | Marcus | 439/76 |
| 4,514,708 | 4/1985 | Ludtke. | |
| 4,578,739 | 3/1986 | McKee et al. | |

FOREIGN PATENT DOCUMENTS 0206132 8/1979 Fed. Rep. of Germany ........ 439/65

Primary Examiner—Larry I. Schwartz
Assistant Examiner—Hien D. Vu
Attorney, Agent, or Firm—Daniel K. Nichols; Dale W. Dorinski

[57] ABSTRACT

An integral electrical interconnection is made between two circuit carrying substrates (100 and 110). The first circuit carrying substrate (100) contains one or more protrusions (102) on the peripheral edge of the substrate (100) which couples to a series of one or more apertures (104) on the peripheral edge of a second circuit carrying substrate (110). Both the tabs and the apertures are covered with conductive materials (202 and 210) also connected to the circuit.

5 Claims, 4 Drawing Sheets

FIG.2
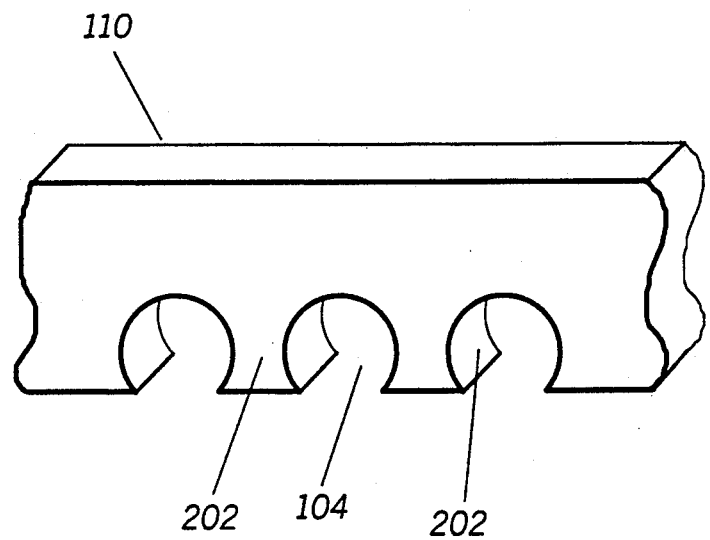
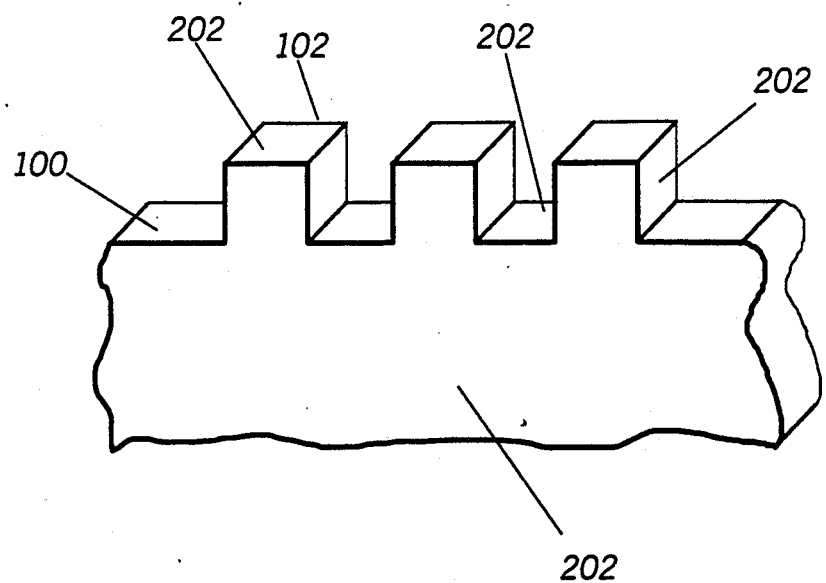

FIG.4
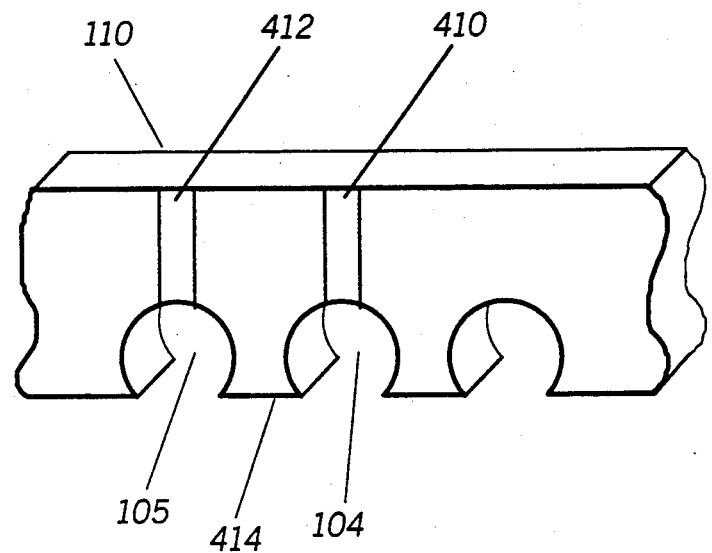
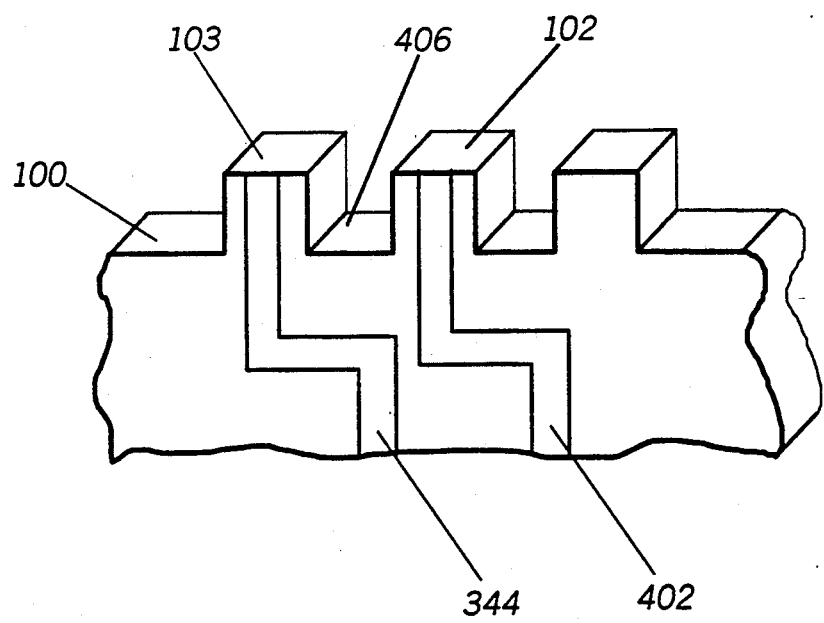

SOLDERLESS INTERCONNECT

This is a continuation of application Ser. No. 07/558,282, filed Jul. 26, 1990, and now abandoned.

TECHNICAL FILED

This invention relates generally to electrical interconnection devices, and more specifically to a means of electrically interconnecting two or more circuit carrying substrates to effect a connection to multiple conductors or to connect shielding surfaces to provide a continuous shielding means for electromagnetic interference.

BACKGROUND

Numerous mechanical and metallurgical schemes have been employed in an attempt to reliably mate two circuit carrying substrates to provide an electrical interconnection there between. For example, pins on one substrate have been configured to plug into receptacles on a second substrate. The use of pins and plugs requires additional parts that increase the overall height of the assembly to the point where this technique is undesirable for use in devices that require very high density packaging.

Also, compliant metal springs or conductive elastomers are known to be inserted between the two substrates, the assembly being held together with clips or bands. Conductive elastomer interconnections reduce the height of the assembly, but require additional holding devices to provide the constant force required to insure deformation and conductivity of the elastomer. In addition, elastomer interconnections generally are relatively high resistance and not suitable for applications requiring low resistance connections, such as analog circuitry.

lastly, a metallurgical solder joint is most commonly formed between the two substrates using techniques known to those skilled in the art. Soldering provides a low profile, low resistance interconnection, however, the interconnection is not amenable to repeated disconnections. A soldered interconnection is often difficult to remove without damaging the accompanying substrates. In circuits fabricated from more advanced engineering thermoplastics, the soldering operation can deform or damage the underlying substrate, destroying the entire assembly. The connection formed by conventional soldering methods is also quite rigid, and can lead to significant mechanical stresses in the substrates after joining. In cases where a large areas of the substrate is to be joined to another substrate, such as in power transistors, ground planes, or shielding applications, effecting the solder joint can be quite difficult, requiring a skilled artisan. In these cases, the assembly of circuits and electrical interconnections must be performed manually, and leads to higher cost and lower quality than if performed by machines in an automated production environment.

Iin other applications, a conductive shield may be required to be configured about a circuit. However, the metal may not be amenable to soldering or welding. Such is the case in shielding applications where the interior of a shield is coated with nickel or other metal to provide shielding for devices capable of emanating electromagnetic radiation. These metal surfaces are not typically solderable, and the interconnection must be made by mechanical means. The connection cannot be welded however, because the heat produced during welding will deform the plastic housing.

When it is desired to shield sensitive portions of electrical circuits, a metal enclosure is typically placed over the affected portions of the circuit, and soldered to the circuit carrying substrate. For certain applications, the soldering operation must be precisely performed to insure that no large openings remain that will permit unwanted electromagnetic radiation to pass. Because of the uncontrollable nature of the soldering operation, it is difficult to insure that the enclosure has been reliably soldered. Clearly, an improved method of providing a uniform electrical seal is needed.

SUMMARY OF THE INVENTION

Briefly, according to the invention, an electrical interconnection is made between two or more electrical circuit carrying substrates. The first circuit carrying substrate contains one or more protrusions (or tabs) along at least one edge of the substrate, which mates to one or more apertures along an edge of the second circuit carrying substrate. Both the tabs and the apertures are covered with conductive materials that permit the interconnection of the circuit thereon.

BRIEF DESCRIPTION OF THE DRAWINGS

FIG. 2 is an isometric illustration of the circuit carrying substrates of FIG. 1.

FIG. 4 is an isometric illustration of the two circuit carrying substrates, showing an alternate embodiment of the invention.

DETAILED DESCRIPTION OF THE PREFERRED EMBODIMENT

Figure 1:
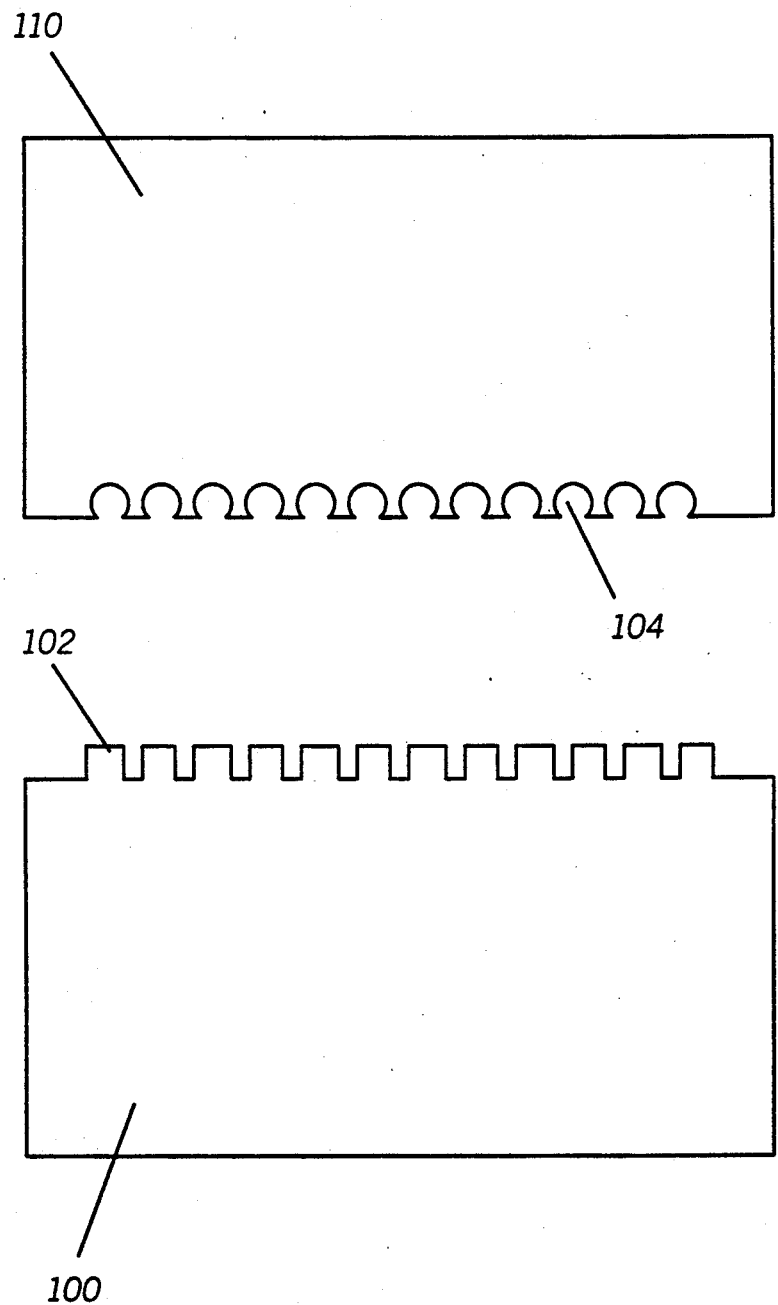
FIG. 1 is an illustration of two circuit carrying substrates in accordance with the invention, prior to interconnection.

Referring to FIG. 1, a circuit carrying substrate 100 is formed of a deformable material such that one peripheral edge of the first substrate exhibits one or more protrusions 102. The width and height of these protrusions are typically made to be approximately the same as the thickness of the circuit carrying substrate 100, however, these proportions can be varied as necessary, depending on such factors as the flexibility of the substrate material, the number of protrusions required, and the amount of insertion and retaining force desired in the assembled interconnection. Dimensional variation to achieve the desired retaining force is well known to those skilled in the art.

A second circuit carrying substrate 110 is formed of a deformable material such that at least one peripheral edge of the substrate exhibits one or more apertures 104 that correspond to the protrusions 102 on the first circuit carrying substrate 100. The dimensions of the apertures 104 are such that the protrusions 102 and apertures 104 must deform somewhat in order to effect the electrical interconnection (i.e., a friction or interference fit).

Depending on the application, as few as one protrusion 102 and one aperture 104 can be used to join the first and second circuit carrying substrates 100 and 110. However, if it is desired to effect an interconnection for shielding applications, a series of protrusions 102 and apertures 104 can be formed along the respective edges of the first and second circuit carrying substrates 100 and 110.

Figure 3:
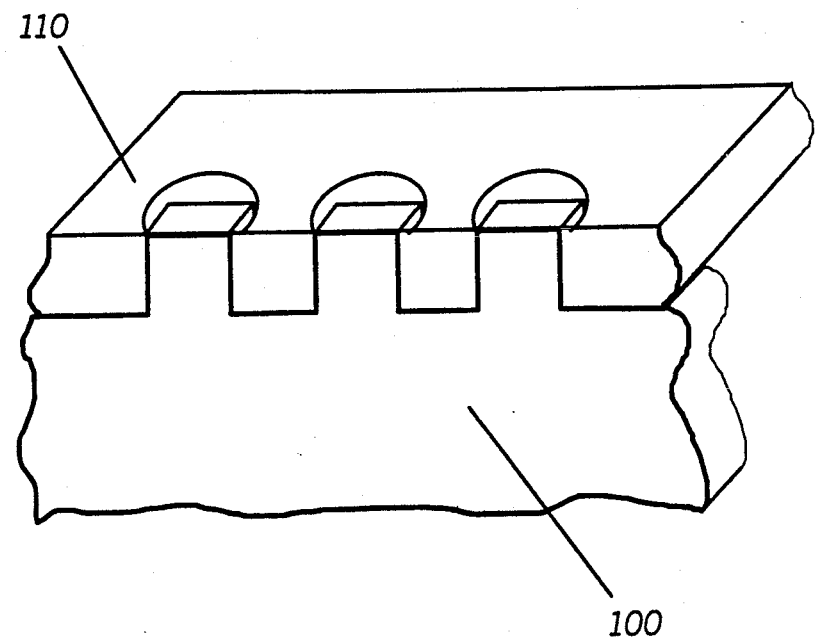
FIG. 3 is an isometric illustration of the circuit carrying substrates of FIG. 1 after interconnection.

Referring to FIG. 2, the preferred embodiment of the invention is shown wherein the surfaces of the circuit carrying substrates 100 and 110 are covered with conductive material 202. When the first circuit carrying substrate 100 is intercoupled with the second circuit carrying substrate 110, the leading edges of the apertures 104 will partially deform, to allow coupling to the protrusions. When fully inserted, the protrusions 102 will electrically contact the apertures 104 such that an electrically continuous connection is formed between the respective substrates. The spacing and size of the protrusions and apertures may be controlled following conventional procedure so that the openings remaining after coupling the two substrates are of a size and spacing prohibiting the ingress or egress of electromagnetic radiation. The minimum size and spacing of these openings can be easily determined by those skilled in the art if the approximate frequency of the electromagnetic radiation is known. FIG. 3 illustrates circuit carrying substrates 100 and 110 after interconnection. In this example, the circuit carrying substrates 100 and 110 are interconnected in a non-planar configuration. As can be seen from FIGS. 2 and 3, the final geometry of the interconnected substrates can be varied to effect the desired configuration required for shielding the device.

Figure 5:
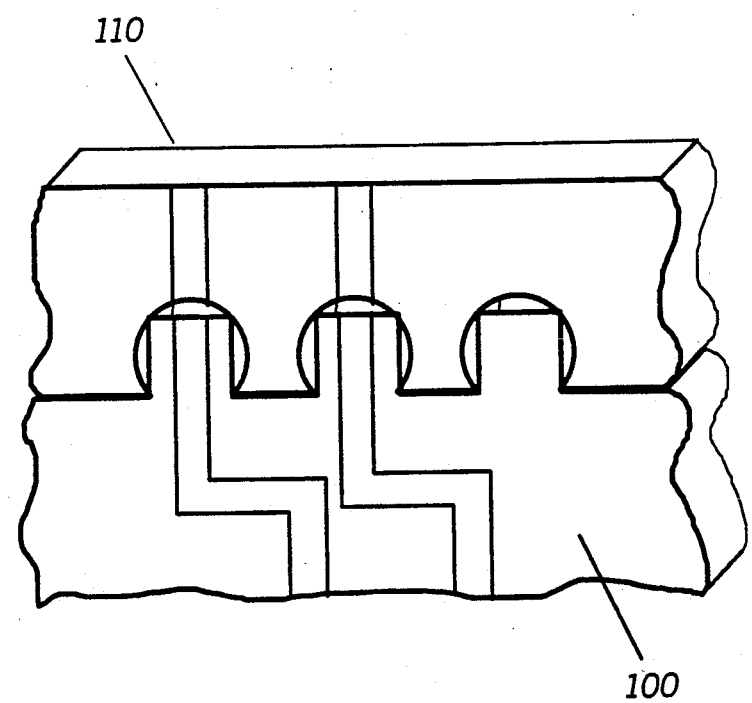
FIG. 5 is an isometric illustration of the circuit carrying substrates of FIG. 4 after interconnection.

In FIG. 4, the details of another embodiment of the invention can be seen. A circuit conductor 402 terminates at the peripheral edge of the circuit carrying substrate 100 on the protrusion 102. Some of the surfaces of the protrusion 102 are also directly connected to the conductor 402, but are separated from the conductive faces of the protrusion 103 by a discontinuity 406 in the conductive surfaces. This discontinuity 406 provides a unique electrical interconnection of the respective conductors 402 and 410, and maintains electrical separation of conductors 402 and 344. The interior surfaces of the mating apertures 104 and 105 on the circuit carrying substrate 110 are also covered with a conductive material, but are likewise separated by a discontinuity 414 that provides the same functionality as the discontinuity 406. Conductors 410 and 412 are directly connected to the conductive surfaces in respective apertures 104 and 105. Accordingly, when the two circuit carrying substrates 100 and 110 are coupled as discussed above, the electrical connections between the substrates will be formed (FIG. 5).

It is understood that the configuration of the protrusions and apertures is not required to be precisely as illustrated in FIGS. 1-5. For example, the shape of the protrusions may be spherical, elliptical, polygonal, or other irregular shapes as desired to effect the required interconnection. The corresponding apertures may be essentially rectangular, elliptical, polygonal, or other irregular shapes as required to couple with the selected apertures.

What is claimed is:

1. A solderless electrical interconnection system, comprising:
   a deformable first circuit carrying substrate at least partially covered with conductive material, constructed and arranged to have at least one protruding member disposed on at least one peripheral edge of the first circuit carrying substrate, said protruding member being an integral part of, and formed from the same material as, the deformable circuit carrying substrate; and
   a deformable second circuit carrying substrate at least partially covered with conductive material constructed and arranged to have at least one aperture disposed on at least one peripheral edge of the second circuit carrying substrate, so as to co-operatively interconnect with the protruding member of the first circuit carrying substrate to form a solderless electrical interconnection both circuit carrying substrates comprising a material which deforms during interconnection to provide an interference fit between the protruding member of the first circuit carrying substrate and the aperture of the second circuit carrying substrate.

2. The electrical interconnection system of claim 1, wherein both the first and the second substrates are at least partially covered with a conductive material, so as to provide an electrically continuous interconnection suitable for use as a shield for electromagnetic radiation.

3. A solderless electrical interconnection system, comprising:
   a deformable first circuit carrying substrate having an electrical circuit pattern, the substrate constructed and arranged to have at least one protruding member disposed on at least one peripheral edge of the substrate, the protruding member comprising a single conductor of the electrical circuit pattern and being an integral part of, and formed from the same material as, the deformable circuit carrying substrate; and
   a deformable second circuit carrying substrate having an electrical circuit pattern, constructed and arranged to have at least one aperture disposed on at least one peripheral edge of the substrate so as to co-operatively interconnect with the protruding member of the first circuit carrying substrate to form a solderless electrical interconnection between the single conductor of the first circuit carrying substrate and the circuit pattern of the second circuit carrying substrate, both circuit carrying substrates comprising a material which deforms during interconnection to provide an interference fit between the protruding member of the first circuit carrying substrate and the aperture of the second circuit carrying substrate.

4. A solderless electrical interconnection system, comprising:
   a deformable first circuit carrying substrate having an electrical circuit pattern, the substrate constructed and arranged to have at least one protruding member disposed on at least one peripheral edge of the substrate, the protruding member comprising a portion of the electrical circuit pattern and being an integral part of, and formed from the same material as, the deformable circuit carrying substrate; and
   a deformable second circuit carrying substrate having an electrical circuit pattern, constructed and arranged to have at least one aperture disposed on at least one peripheral edge of the substrate, the aperture comprising a single conductor of the electrical circuit, so as to co-operatively interconnect with the protruding member of the first circuit carrying substrate to form a unique solderless electrical interconnection between the circuit pattern of the first circuit carrying substrate and the single conductor of the second circuit carrying substrate, both circuit carrying substrates comprising a material which deforms during interconnection to provide an interference fit between the protruding member of the first circuit carrying substrate and the aperture of the second circuit carrying substrate.

5. The solderless electrical interconnection as described in claim 4, wherein the first substrate has a protruding member comprising a single conductor of the electrical circuit pattern.

* * * * *